United States Patent
Yoshida

(10) Patent No.: US 9,735,592 B2
(45) Date of Patent: Aug. 15, 2017

(54) BATTERY CONTROL SYSTEM, BATTERY PACK, ELECTRONIC DEVICE

(71) Applicant: Tadahiro Yoshida, Kanagawa (JP)

(72) Inventor: Tadahiro Yoshida, Kanagawa (JP)

(73) Assignee: NEC ENERGY DEVICES, LTD., Kanagawa (JP)

( * ) Notice: Subject to any disclaimer, the term of this patent is extended or adjusted under 35 U.S.C. 154(b) by 272 days.

(21) Appl. No.: 14/381,886

(22) PCT Filed: Feb. 8, 2013

(86) PCT No.: PCT/JP2013/000710
§ 371 (c)(1),
(2) Date: Aug. 28, 2014

(87) PCT Pub. No.: WO2013/128810
PCT Pub. Date: Sep. 6, 2013

(65) Prior Publication Data
US 2015/0069973 A1     Mar. 12, 2015

(30) Foreign Application Priority Data
Feb. 29, 2012 (JP) ................. 2012-044634

(51) Int. Cl.
*H02J 7/00* (2006.01)
*H01M 10/48* (2006.01)
(Continued)

(52) U.S. Cl.
CPC ......... *H02J 7/0021* (2013.01); *B60L 11/1864* (2013.01); *G01R 31/361* (2013.01);
(Continued)

(58) Field of Classification Search
CPC ... H02J 7/0021; H02J 2007/004; H01M 10/44
(Continued)

(56) References Cited

U.S. PATENT DOCUMENTS

| | | | |
|---|---|---|---|
| 5,493,197 A | 2/1996 | Eguchi et al. | |
| 2009/0198399 A1* | 8/2009 | Kubo | B60L 11/1855 701/22 |
| 2011/0238250 A1* | 9/2011 | Takao | B60L 1/16 701/22 |

FOREIGN PATENT DOCUMENTS

| CN | 101232193 A | 7/2008 |
|---|---|---|
| EP | 0588613 A2 | 3/1994 |

(Continued)

OTHER PUBLICATIONS

Communication dated Feb. 16, 2016, from the State Intellectual Property Office of People's Republic of China in counterpart Application No. 201380011502.8.

(Continued)

Primary Examiner — Edward Tso
Assistant Examiner — Aaron Piggush
(74) Attorney, Agent, or Firm — Sughrue Mion, PLLC

(57) ABSTRACT

A measurement unit (200) measures voltages and currents of battery cells (100). A battery control unit (400) calculates a present estimation value of a residual capacity of the battery cells (100) by integrating the currents. The voltages of the battery cells (100) are set to a reference voltage value $V_1$ serving as a trigger of a process of correcting the estimation value of the residual capacity and an alarm voltage value $V_a$ which is a voltage higher than the reference voltage value. In addition, the battery control unit (400) continues discharge of all the battery cells (100), as it is, when an alarm condition in which a voltage of a minimum capacity cell is equal to or less than the alarm voltage value is not satisfied, and outputs a first signal when the voltage of the minimum capacity cell satisfies the alarm condition.

9 Claims, 10 Drawing Sheets

(51) Int. Cl.
  *G01R 31/36* (2006.01)
  *B60L 11/18* (2006.01)
  *H01M 10/44* (2006.01)
  *H01M 10/46* (2006.01)

(52) U.S. Cl.
  CPC ...... *G01R 31/3658* (2013.01); *H01M 10/482* (2013.01); *H02J 7/007* (2013.01); *H02J 7/0016* (2013.01); *H01M 10/44* (2013.01); *H01M 10/441* (2013.01); *H01M 10/465* (2013.01); *H01M 2220/20* (2013.01); *H02J 7/0029* (2013.01); *H02J 2007/004* (2013.01); *Y02T 10/7011* (2013.01); *Y02T 10/7055* (2013.01); *Y02T 10/7061* (2013.01)

(58) Field of Classification Search
  USPC ........ 320/118, 132, 134, 136, 164; 324/433; 701/22
  See application file for complete search history.

(56) References Cited

FOREIGN PATENT DOCUMENTS

| | | |
|---|---|---|
| JP | 05-087896 A | 4/1993 |
| JP | 06-104015 A | 4/1994 |
| JP | 06-176798 A | 6/1994 |
| JP | 9215111 A | 8/1997 |
| JP | 2001177918 A | 6/2001 |
| JP | 2002-238106 A | 8/2002 |
| JP | 200377548 A | 3/2003 |
| JP | 2003-217679 A | 7/2003 |
| JP | 2003257501 A | 9/2003 |
| JP | 2007-139549 A | 6/2007 |
| JP | 2009-052975 A | 3/2009 |
| JP | 2009-097954 A | 5/2009 |
| JP | 2012-023919 A | 2/2012 |

OTHER PUBLICATIONS

International Search Report for PCT/JP2013/000710 dated Mar. 12, 2013.

Communication dated Feb. 14, 2017, issued by the Japan Patent Office in corresponding Japanese Application No. 2014-501994.

Communication dated May 23, 2017, issued from the Japan Patent Office in counterpart Japanese Patent Application No. 2014-501994.

* cited by examiner

FIG. 3
(a)
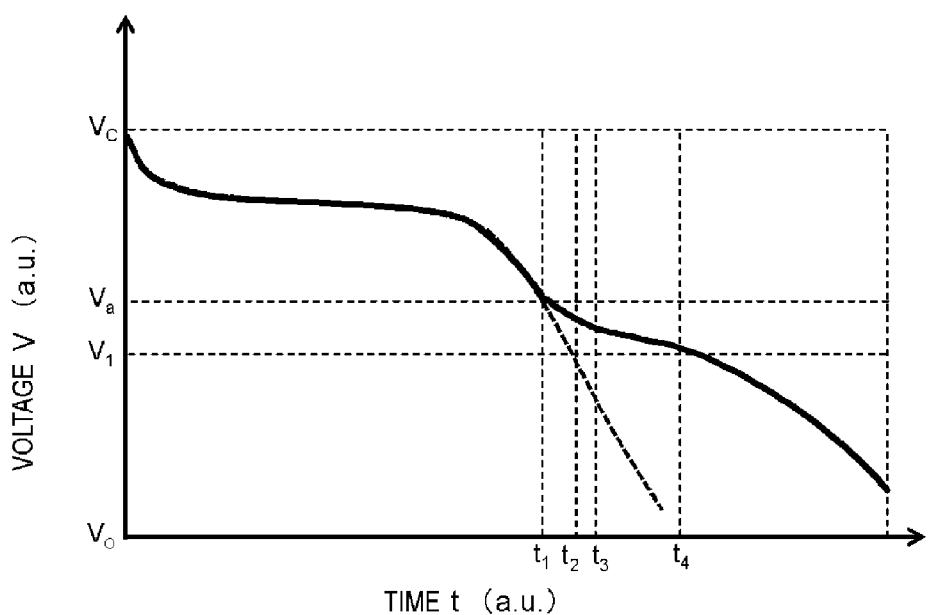
(b)
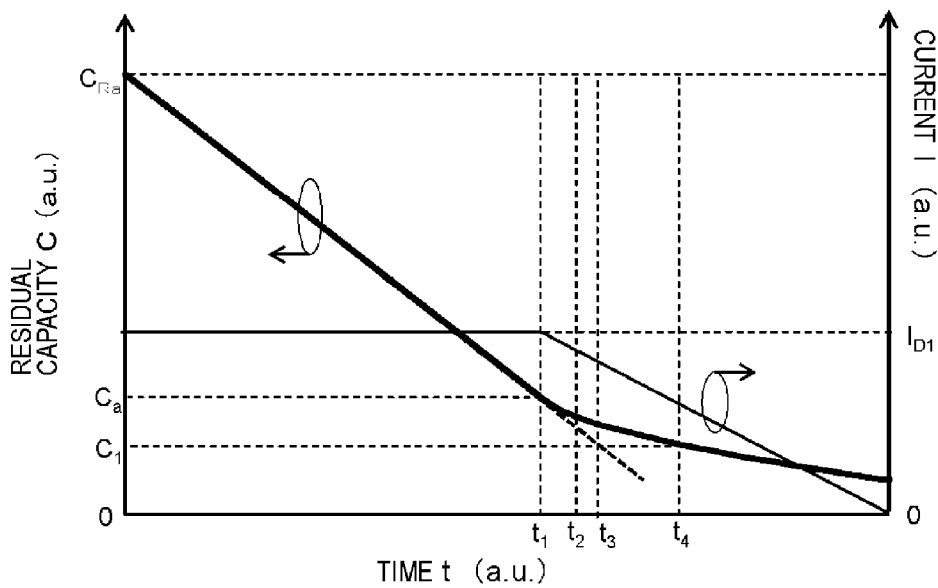

FIG. 4
(a)
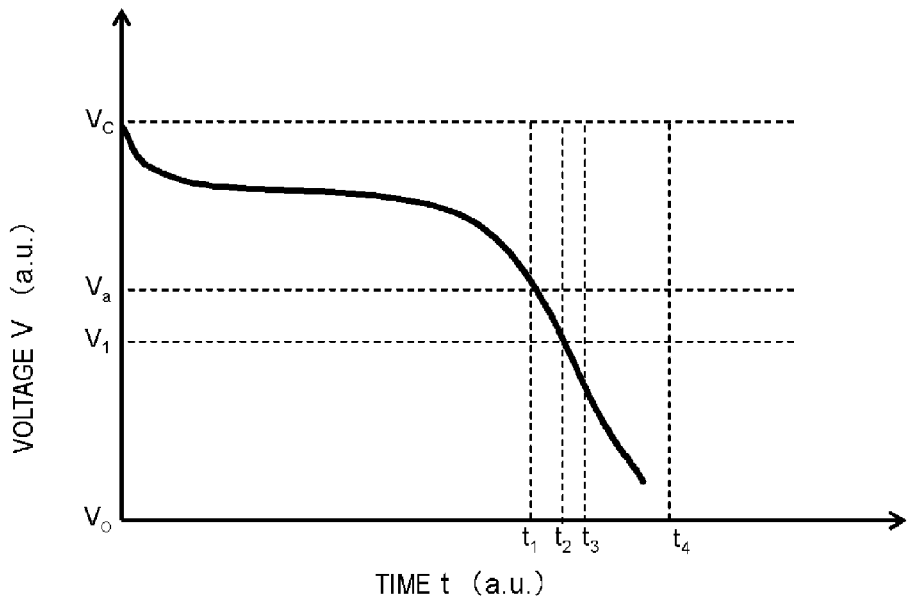
(b)
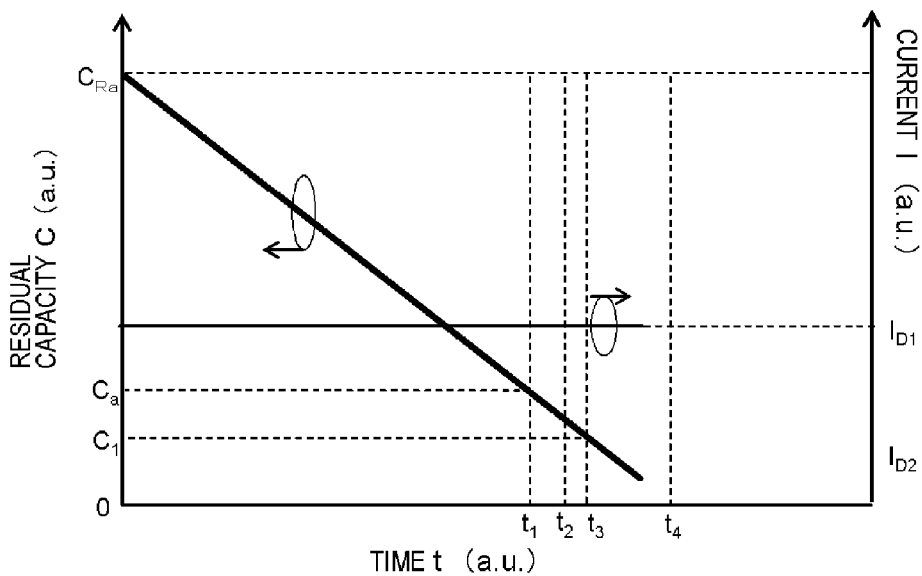

FIG. 6
(a)
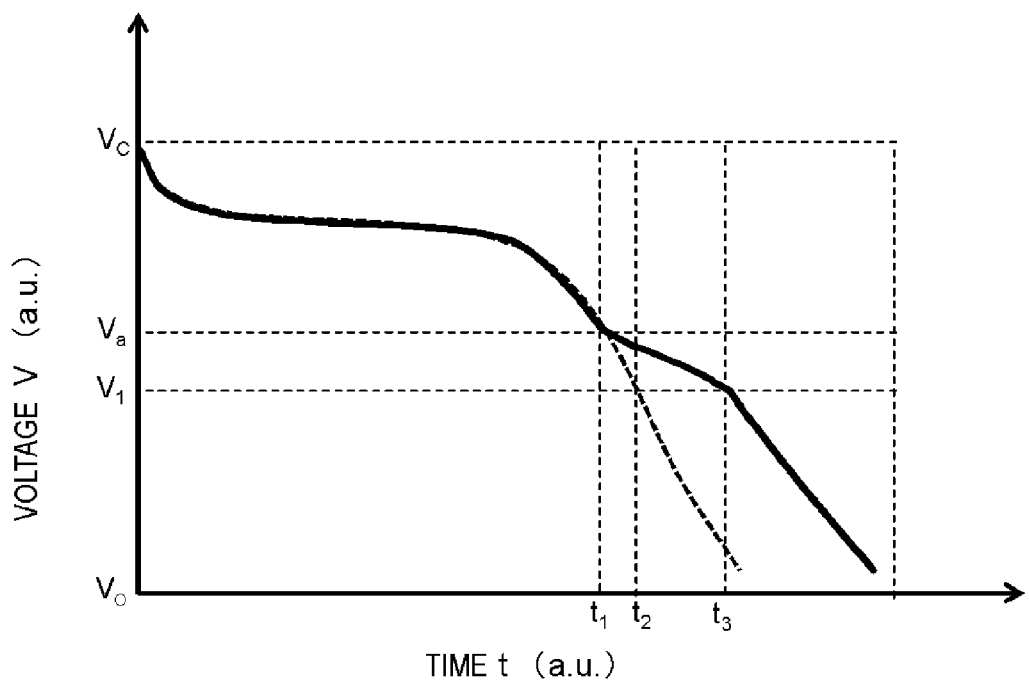
(b)
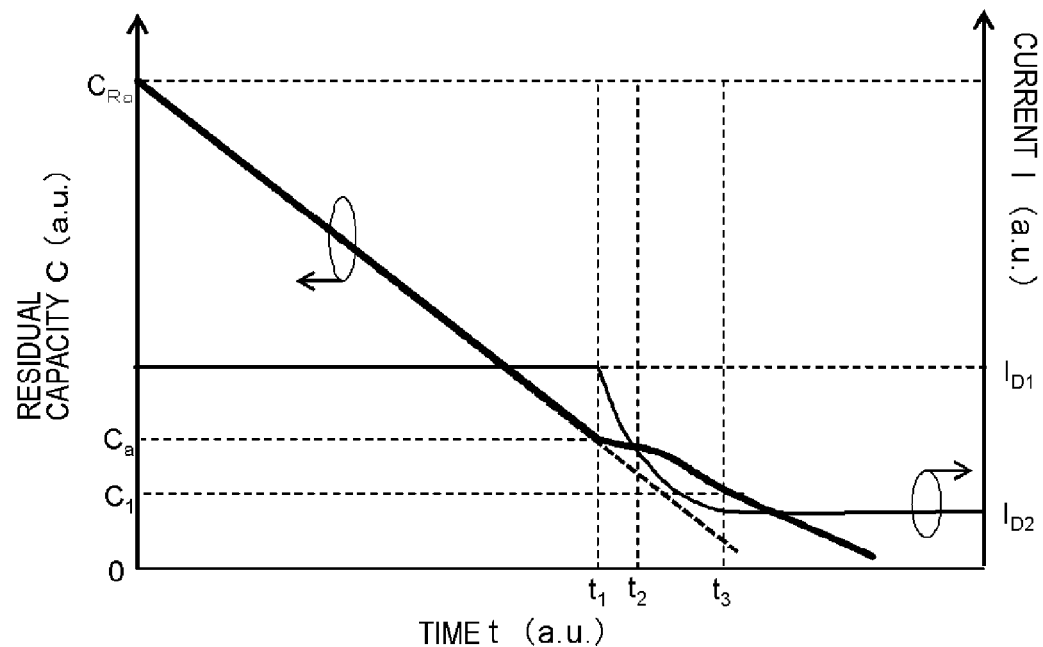

BATTERY CONTROL SYSTEM, BATTERY PACK, ELECTRONIC DEVICE

CROSS REFERENCE TO RELATED APPLICATIONS

This application is a National Stage of International Application No. PCT/JP2013/000710 filed Feb. 8, 2013, claiming priority based on Japanese Patent Application No. 2012-044634, filed Feb. 29, 2012, the contents of all of which are incorporated herein by reference in their entirety.

TECHNICAL FIELD

The present invention relates to a battery control system, a battery pack and an electronic device.

BACKGROUND ART

Various methods for using a battery pack continuously are proposed.

Patent Document 1 (Japanese Unexamined Patent Publication No. 2003-217679) discloses the following discharge method. Whenever a battery voltage drops to a discharge termination voltage during discharge of a secondary battery, the secondary battery is intermittently discharged while repeating a temporary stop. In this case, when the discharge is restarted after a temporary stop, the discharge is performed while a discharge current is reduced in a stepwise manner. Thereby, compared to a case where high-rate discharge is performed continuously, it is possible to extract a great deal of power from a secondary battery.

In addition, Patent Document 2 (Japanese Unexamined Patent Publication No. H5-87896) discloses a battery residual capacity detection and correction method as described below. A battery residual capacity calculation value calculated from current consumption is corrected on the basis of a real battery residual capacity which is obtained in advance. Thereby, it is possible to perform a display or the like by further reducing a difference between a battery residual capacity and a battery residual capacity calculation value and obtaining an accurate battery residual capacity calculation value.

RELATED DOCUMENTS

Patent Documents

[Patent Document 1] Japanese Unexamined Patent Publication No. 2003-217679
[Patent Document 2] Japanese Unexamined Patent Publication No. H5-87896

DISCLOSURE OF THE INVENTION

A battery pack or an electronic device using the battery pack may be provided with a display unit that displays a present residual capacity to a user. Such a display of a residual capacity may be forcibly corrected depending on the state of the battery pack. In this manner, a drastic change in residual capacity to be displayed is inconvenient for a user.

According to the present invention, there is provided a battery control system including: a measurement unit that measures voltages and currents of a plurality of battery units which are connected in series to each other; and a battery control unit that controls discharge of the battery units on the basis of the voltages measured by the measurement unit, wherein the battery control unit specifies a minimum capacity unit in which the voltage is lowest, on the basis of the voltages measured by the measurement unit, when the discharge of the battery units is performed, calculates an estimation value of a present residual capacity of the battery units by integrating the currents, sets the voltages of the battery unit to a reference voltage value serving as a trigger of a process of correcting the estimation value of the residual capacity and an alarm voltage value which is a voltage higher than the reference voltage value, continues the discharge of all the battery units, as it is, when an alarm condition in which the voltage of the minimum capacity unit is equal to or less than the alarm voltage value is not satisfied, and outputs a first signal when the voltage of the minimum capacity unit satisfies the alarm condition.

According to the present invention, there is provided a battery pack including: a plurality of battery units which are connected in series to each other; a measurement unit that measures voltages and currents of the battery units; and a battery control unit that controls discharge of the battery units on the basis of the voltages measured by the measurement unit, wherein the battery control unit specifies a minimum capacity unit in which the voltage is lowest, on the basis of the voltages measured by the measurement unit, when the discharge of the battery units is performed, calculates an estimation value of a present residual capacity of the battery units by integrating the currents, sets the voltages of the battery unit to a reference voltage value serving as a trigger of a process of correcting the estimation value of the residual capacity and an alarm voltage value which is a voltage higher than the reference voltage value, continues the discharge of all the battery units, as it is, when an alarm condition in which the voltage of the minimum capacity unit is equal to or less than the alarm voltage value is not satisfied, and outputs a first signal when the voltage of the minimum capacity unit satisfies the alarm condition.

According to the present invention, there is provided an electronic device including: a battery pack that includes a plurality of battery units which are connected in series to each other; a measurement unit that measures voltages and currents of the battery units; a battery control unit that controls discharge of the battery units on the basis of the voltages measured by the measurement unit; a load that consumes power of the discharge from the battery pack; and a load control unit, connected to the battery control unit, which controls the load, wherein the battery control unit specifies a minimum capacity unit in which the voltage is lowest, on the basis of the voltages measured by the measurement unit, when the discharge of the battery units is performed, calculates an estimation value of a present residual capacity of the battery units by integrating the currents, sets the voltages of the battery unit to a reference voltage value serving as a trigger of a process of correcting the estimation value of the residual capacity and an alarm voltage value which is a voltage higher than the reference voltage value, continues the discharge of all the battery units, as it is, when an alarm condition in which the voltage of the minimum capacity unit is equal to or less than the alarm voltage value is not satisfied, and outputs a first signal when the voltage of the minimum capacity unit satisfies the alarm condition, and the load control unit reduces the discharge current when the first signal is received from the battery control unit.

According to the present invention, the voltages of the battery units are set to the reference voltage value serving as a trigger of a process of correcting the estimation value of the residual capacity and the alarm voltage value which is a voltage higher than the reference voltage value. When the alarm condition in which the voltage of the minimum capacity unit is equal to or less than the alarm voltage value is satisfied, the battery control unit outputs the first signal. The electronic device having received the first signal reduces the discharge current from the battery pack. Thereby, it is possible to prevent the estimation value of the residual capacity from being forcibly corrected due to the voltages of the battery units reaching the reference voltage value, and to use the battery pack continuously.

BRIEF DESCRIPTION OF THE DRAWINGS

The above-mentioned objects, other objects, features and advantages will be made clearer from the preferred embodiments described below, and the following accompanying drawings.

FIG. 3(a) shows a relationship between the time from a discharge start time and the voltage of the minimum capacity cell in the first embodiment. FIG. 3(b) shows a relationship between the time from the discharge start time and the residual capacity of the minimum capacity cell in the first embodiment.

FIG. 4(a) shows a relationship between the time from the discharge start time and the voltage of the minimum capacity cell in the comparative example. FIG. 4(b) shows a relationship between the time from the discharge start time and the residual capacity of the minimum capacity cell in a comparative example.

FIG. 6(a) shows a relationship between the time from the discharge start time and the voltage of the minimum capacity cell in the second embodiment. FIG. 6(b) shows a relationship between the time from the discharge start time and the residual capacity of the minimum capacity cell in the second embodiment.

DESCRIPTION OF EMBODIMENTS

Figure 1:
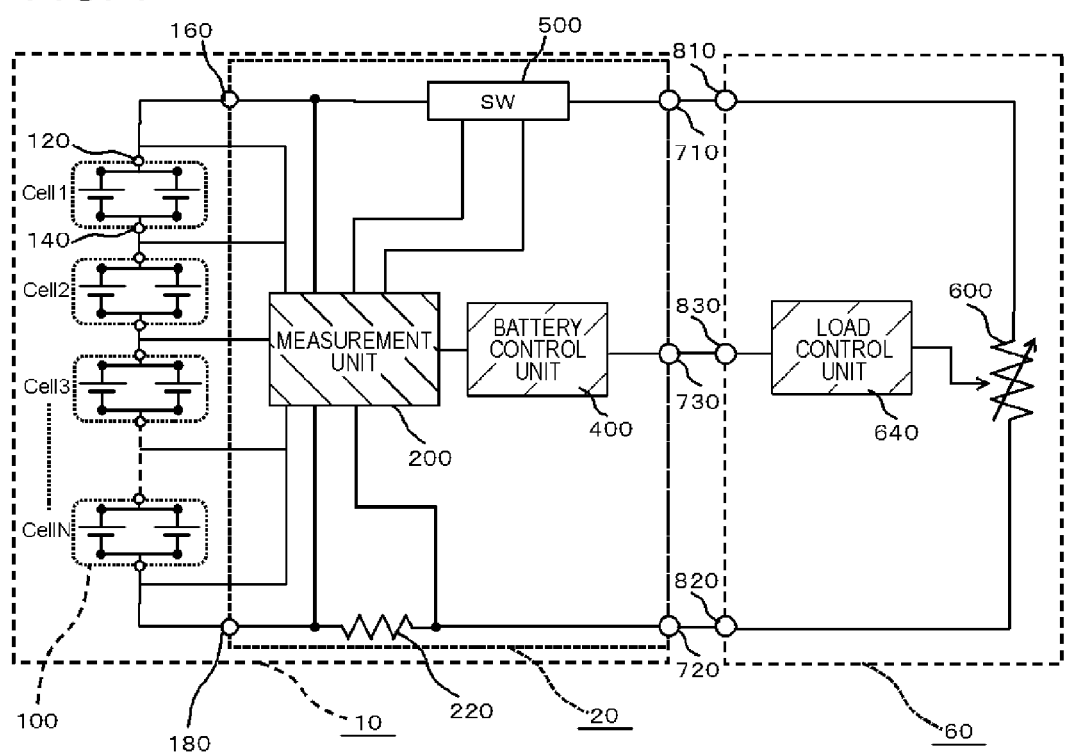
FIG. 1 is a circuit diagram illustrating a configuration of a battery pack and an electronic device according to a first embodiment.

Hereinafter, embodiments of the present invention will be described with reference to the accompanying drawings. In all the drawings, like elements are referenced by like reference numerals and descriptions thereof will not be repeated.

The term "battery pack 10" as used herein refers to an assembled battery having a plurality of battery units. In addition, the term "battery unit" refers to a unit having at least one or more battery cells 100. Further, the battery cell 100 included in the "battery unit" may include a plurality of single batteries having a positive electrode, a negative electrode and the like. In addition, a plurality of "battery units" may include a different quantity of the battery cells 100, respectively. In the following, a description will be given of a case where the "battery unit" included in the "battery pack 10" is the battery cell 100 having two single batteries which are connected in parallel to each other.

First Embodiment

The battery pack 10 according to the first embodiment will be described with reference to FIG. 1. FIG. 1 is a circuit diagram illustrating a configuration of the battery pack 10 and an electronic device 60 according to the first embodiment. The battery pack 10 includes a plurality of battery cells 100, a measurement unit (measurement unit 200), and a battery control unit (battery control unit 400). The plurality of battery cells 100 are connected in series to each other. The measurement unit 200 measures the voltages and currents of the battery cells 100. The battery control unit 400 controls discharge of the battery cells 100 on the basis of the voltages measured by the measurement unit 200. When the discharge of the battery cells 100 is performed, the battery control unit 400 specifies a minimum capacity cell having the lowest voltage on the basis of the voltages measured by the measurement unit 200. In addition, the battery control unit 400 calculates an estimation value of the residual capacity of the present battery cell 100 by integrating a current. A reference voltage value $V_1$ serving as a trigger of a process of correcting the estimation value of the residual capacity and an alarm voltage value $V_a$ which is a voltage higher than the reference voltage value are set as the voltages of the battery cells 100. In addition, the battery control unit 400 continues the discharge of all the battery cells 100, as it is, when an alarm condition in which the voltage of the minimum capacity cell is equal to or less than the alarm voltage value is not satisfied, and outputs a first signal when the voltage of the minimum capacity cell satisfies the alarm condition. Hereinafter, a detailed description will be given.

As shown in FIG. 1, the battery pack 10 includes a plurality of battery cells 100. Here, the battery pack 10 includes, for example, N battery cells 100. In addition, as described above, the battery cell 100 has two single batteries. Specifically, the battery cell 100 is a Li-ion secondary battery. In addition, the battery cell 100 is, for example, a laminate-type battery in which a laminate film is used in an exterior material. In the battery pack 10 according to the first embodiment, the plurality of battery cells 100 are received in exterior bodies (not shown), respectively, and are packaged in the battery pack 10 in a state where the battery cells are placed in a row. Meanwhile, the package aspect of the battery cell 100 may be formed in an arbitrary manner, and may be formed, for example, in a state where the plurality of battery cells 100 are laminated in a row in the thickness direction thereof, or in a state where the laminated battery cells 100 are disposed adjacent to a plurality of rows. In such a package or the like, it is also possible to obtain the same effect as that in the first embodiment.

The full charge capacity of the battery pack 10 is reduced by repeating charge and discharge. In this process, it is not always true that the full charge capacity of each of the battery cells 100 is reduced equally. When the battery pack 10 is discharged, the battery cell 100 of which the full charge capacity is most reduced has a drop in voltage during discharge faster than other battery cells 100. The "full charge capacity" as used herein refers to a capacity (having a unit of Ah) when the battery cell 100 is fully charged. Here, the battery cell 100 having s smallest full charge capacity is called the "minimum capacity cell".

The battery pack 10 according to the first embodiment includes a control circuit 20 in addition to the battery cells 100. The control circuit 20 includes a measurement unit 200, a battery control unit 400 and a switch 500.

In addition, the control circuit 20 is connected to the battery cells 100 which are connected in series to each other. The control circuit 20 includes an internal positive electrode terminal 160, an internal negative electrode terminal 180, an external positive electrode terminal 710 and an external negative electrode terminal 720. The internal positive electrode terminal 160 is connected to a positive electrode terminal 120 of one battery cell 100 connected in series. In addition, the internal negative electrode terminal 180 is connected to a negative electrode terminal 140 of the other battery cell 100 connected in series.

The internal positive electrode terminal 160 is connected to the external positive electrode terminal 710 for connection to an external device using the battery pack 10 through an interconnect (not shown) within the control circuit 20. In addition, the internal negative electrode terminal 180 is also connected to the external negative electrode terminal 720 similarly.

The switch 500 for stopping charge or discharge is provided between the internal positive electrode terminal 160 and the external positive electrode terminal 710. The switch 500 is provided between, for example, the internal positive electrode terminal 160 on the battery cell 100 side and the external positive electrode terminal 710. In this case, the switch 500 is, for example, a P-channel metal oxide semiconductor field effect transistor (MOSFET). Two P-channel MOSFETs are provided within the switch 500. Thereby, one MOSFET is used for controlling charge. On the other hand, the other MOSFET is used for controlling discharge. In addition, each MOSFET in the switch 500 is connected to the measurement unit 200.

Meanwhile, when the switch 500 is an N-channel MOSFET, the switch 500 is disposed between the internal negative electrode terminal 180 and the external negative electrode terminal 720. Besides, the switch 500 may be, for example, an insulated gate bipolar transistor (IGBT), a relay or a breaker.

The measurement unit 200 measures the voltage and current of the plurality of battery cells 100. The measurement unit 200 is connected between the battery cells 100 through an interconnect (no sign shown). In addition, the measurement unit 200 measures a voltage of both ends of the internal positive electrode terminal 160 and internal negative electrode terminal 180 in order to measure the total voltage of the plurality of battery cells 100 which are connected in series to each other.

In addition, a resistor 220 of which the resistance value is known is provided between the internal negative electrode terminal 180 and the external negative electrode terminal 720. The measurement unit 200 is connected to both ends of the resistor 220. In this manner, by measuring a voltage value applied to the resistor 220, the measurement unit 200 calculates a value divided by the above resistance value as a value of a current flowing through the battery cell 100.

The battery control unit 400 is connected to the measurement unit 200. The battery control unit 400 controls the discharge of the battery cells 100 on the basis of the voltages measured by the measurement unit 200. The battery control unit 400 includes an arithmetic operation unit (not shown) that performs an arithmetic operation process on the basis of the voltages of the battery cells 100 measured by the measurement unit 200. For example, when the discharge of the battery cells 100 is performed, the battery control unit 400 specifies the minimum capacity cell having the lowest voltage on the basis of the voltages measured by the measurement unit 200.

The battery control unit 400 includes a communication unit (not shown) for transmitting various types of signals to the electronic device 60 or receiving a signal from the electronic device 60. The battery control unit 400 is connected to a communication terminal 730 for transmitting and receiving a signal to the electronic device 60.

In addition, the arithmetic operation unit of the battery control unit 400 calculates a current value from a voltage value of both ends of a resistor 220 which is measured by the measurement unit 200. The battery control unit 400 calculates an estimation value of the residual capacity of the present battery cell 100 by integrating the current value. The "estimation value of the residual capacity" of the battery pack 10 is a total residual capacity of all the battery cells 100 which has been integrated since the charge.

This "estimation value of the residual capacity" is used, for example, for causing a user to recognize the residual capacity. Specifically, the battery control unit 400 outputs a residual capacity signal indicating the estimation value of the residual capacity of the battery cell 100. The signal is transmitted to a load control unit 640 of the electronic device 60 through the communication terminal 730. Thereby, for example, it is possible to notify a user of the estimation value of the residual capacity through a display unit of the electronic device 60 or the like.

Meanwhile, the battery pack 10 may include a display unit (not shown) that displays the estimation value of the residual capacity of the battery cell 100. Thereby, even when which electronic device 60 is used, it is possible to cause a user to recognize the estimation value of the residual capacity of the battery cell 100.

In addition, the battery control unit 400 includes a storage unit (not shown) that stores the measured voltage and current or various types of settings. The storage unit refers to, in other words, a memory region. The reference voltage value $V_1$ and the alarm voltage value $V_a$ described later are set as the voltages of the battery cells 100. The reference voltage value V', the alarm voltage value $V_a$, the estimation value of the residual capacity, and the like are stored in the storage unit of the battery control unit 400.

The "reference voltage value $V_1$" as used herein refers to a voltage value serving as a trigger of a process of correcting the estimation value of the residual capacity. When the voltage of the minimum capacity cell becomes the reference voltage value V', the battery control unit 400 forcibly corrects the estimation value of the residual capacity calculated by the battery control unit 400 to a predetermined "first value" (for example, 10% of the full charge capacity as described later), regardless of the estimation value. That is, the battery control unit 400 forcibly corrects the estimation value of the residual capacity to the predetermined first value due to a drop in the voltage of the minimum capacity cell even in a state where the residual capacities of other battery cells 100 remain.

In addition, the "reference voltage value $V_1$" is higher than a discharge termination voltage value $V_0$ at which the battery cell 100 is over-discharged. Thereby, it is possible to inform a user of a drop in residual capacity before the minimum capacity cell is over-discharged.

For example, a user recognizes the residual capacity of the battery pack 10 on the basis of a display residual capacity of the display unit of the battery pack 10 or the electronic device 60, and uses the electronic device 60. Here, when the voltage of the minimum capacity cell drops to the reference voltage value $V_1$, the battery control unit 400 corrects the estimation value of the residual capacity to the first value and outputs a signal. For example, the load control unit 640 of the electronic device 60 having received the signal performs a display such as "the residual capacity of the battery cell 100 drops to the first value" on the display unit or the like. Thereby, it is possible to indirectly inform a user that the voltage of the minimum capacity cell drops.

Meanwhile, the "first value" to which the residual capacity is forcibly corrected refers to a value larger than at least 0 which is set in advance. Specifically, for example, the "first value" is set by measuring a standard (average) battery cell 100 in advance, and is a value of the residual capacity when the voltage of the standard battery cell 100 becomes the reference voltage value $V_1$ in a case where the standard battery cell 100 is discharged at a predetermined constant current. Alternatively, the "first value" can be set to, for example, a minimum residual capacity required for shutting down the electronic device (60) used by a user. Meanwhile, the unit of the "first value" is Ah. In addition, specifically, the "first value" of the residual capacity is, for example, 10% of the full charge capacity. Thereby, for example, when the electronic device 60 is a computer or the like and has a storage unit, it is possible to prevent the device from being shut down in a state where data cannot be stored. The "first value" is also stored in the storage unit of the battery control unit 400.

Meanwhile, when the voltage of the minimum capacity cell becomes the reference voltage V', and the estimation value of the residual capacity calculated by the battery control unit 400 is equal to or less than the "first value", the estimation value of the residual capacity is a value close to a real residual capacity. For this reason, the estimation value of the residual capacity is not necessarily corrected to the "first value".

In addition, the "alarm voltage value $V_a$" as used herein is a voltage value for giving an alarm that the voltage of the minimum capacity cell comes close to the voltage (reference voltage value $V_1$) for forcibly correcting the estimation value of the residual capacity. For this reason, the "alarm voltage value $V_a$" is set to a voltage value higher than the above-mentioned reference voltage value $V_1$. The "alarm voltage value $V_a$" can be obtained by adding the measurement accuracy of the measurement unit 200 to the reference voltage value $V_1$. The "measurement accuracy of the measurement unit 200" as used herein refers to, for example, the voltage detection accuracy of an IC of the measurement unit 200. Specifically, the "alarm voltage value $V_a$" is, for example, $V_1+100$ mV.

The battery control unit 400 continues the discharge of all the battery cells 100, as it is, when the alarm condition in which the voltage of the minimum capacity cell becomes equal to or less than the alarm voltage value is not satisfied, and outputs the first signal when the voltage of the minimum capacity cell satisfies the alarm condition. The electronic device 60 having received the first signal reduces a discharge current of the battery pack 10. Thereby, it is possible to prevent the estimation value of the residual capacity from being forcibly corrected to the first value due to the voltage of the battery unit reaching the reference voltage value $V_1$. The details of this discharge control method will be described later.

In addition, the measurement unit 200, the battery control unit 400 and the switch 500 improve safety and the cycle life of charge and discharge, and thus function as protection circuits. When the battery cell 100 is discharged down to equal to or less than an over-discharge detection voltage value lower than the discharge termination voltage value $V_0$, the measurement unit 200, the battery control unit 400 and the switch 500 terminate the discharge forcibly.

In this manner, in the first embodiment, the battery pack 10 including the plurality of battery cells 100 and control circuit 20 is packaged.

Next, the electronic device 60 connected to the battery pack 10 according to the first embodiment will be described. The electronic device 60 includes a load 600 and a load control unit (load control unit 640). The load 600 of the electronic device 60 consumes power due to discharge from the battery pack 10. The load control unit 640 is connected to the battery control unit 400, and receives a first signal and controls the load 600. In addition, when the first signal is received from the battery control unit 400, the load control unit 640 reduces a discharge current. Hereinafter, a detailed description will be given.

FIG. 1 schematically shows the electronic device 60. The load 600, provided therein, consumes power due to the discharge from the battery pack 10. In FIG. 1, the load 600 is shown collectively as a variable resistor that consumes power.

Here, the electronic device 60 is, for example, a display device. Specifically, the electronic device 60 is a liquid crystal display device. Therefore, the electronic device 60 includes a display unit, a light-emitting unit, a tuner unit, an operating unit and the like (all not shown) as the load 600. The load 600 includes at least one or more light-emitting units (not shown). The light-emitting unit is, for example, a backlight of a liquid crystal display device.

The load 600 is connected to a positive electrode terminal 810 and a negative electrode terminal 820 through an interconnect (not shown). The positive electrode terminal 810 and the negative electrode terminal 820 of the electronic device 60 are connected to the external positive electrode terminal 710 and the external negative electrode terminal 720 of the battery pack 10 through, for example, an interconnect (no sign shown). Thereby, the electronic device 60 can receive power due to the discharge of the battery pack 10.

The load control unit 640 is connected to the load 600. The load control unit 640 controls the load 600. Thereby, the load control unit 640 controls the amount of power consumption due to the load 600. Specifically, for example, when the load 600 includes a backlight, the load control unit 640 controls the luminance of the backlight.

In addition, the load control unit 640 is connected to a communication terminal 830. The communication terminal 830 on the electronic device 60 side is connected to the communication terminal 730 on the battery pack 10 side through, for example, an interconnect (not shown). Thereby, the load control unit 640 is connected to the battery control unit 400, and can receive the residual capacity signal and the first signal.

The electronic device 60 of the first embodiment is a display device. Therefore, the load control unit 640 can cause the display unit to receive the residual capacity signal of the estimation value of the residual capacity transmitted from the battery control unit 400 and display the estimation value of the residual capacity.

Besides, the load control unit 640 may include an arithmetic operation unit (not shown). The arithmetic operation unit performs an arithmetic operation process in accordance with the first signal described later, and can perform the most appropriate control on the load 600 at that point in time.

When the first signal is received from the battery control unit 400, the load control unit 640 reduces a discharge current. In this case, for example, when the load 600 includes a backlight, the load control unit 640 reduces the discharge current by lowering the luminance of the light-emitting unit. Thereby, it is possible to prevent the minimum capacity cell from being over-discharged. In addition, it is possible to prevent the estimation value of the residual capacity from being corrected forcibly. The details of this discharge control method will be described later.

In addition, when the first signal is received from the battery control unit 400, the load control unit 640 may cause the display unit (not shown) of the electronic device 60 to display the start of control for reducing the discharge current. Thereby, it is possible to prepare a user for the use of the electronic device 60 being restricted.

Figure 2:
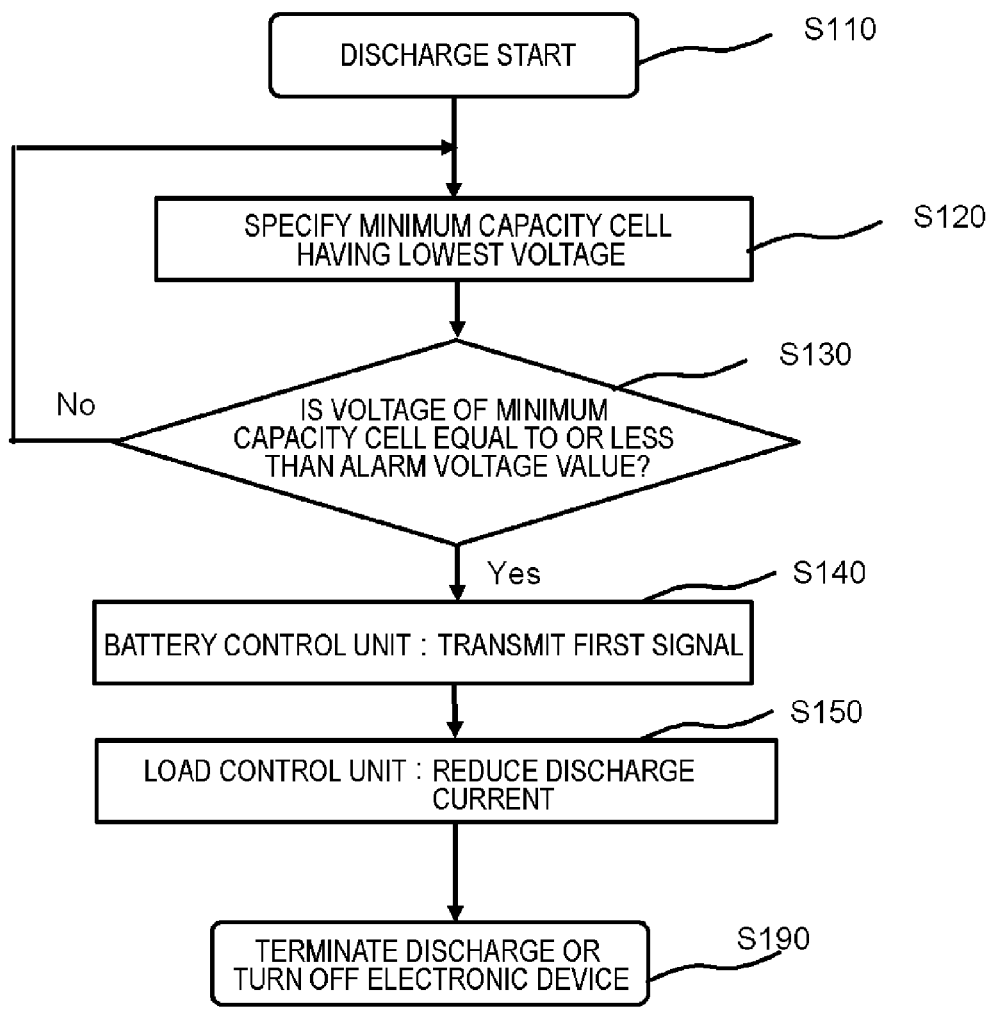
FIG. 2 is a flow diagram illustrating a discharge control method according to the first embodiment.

Next, the discharge control method of the battery pack 10 stated above will be described with reference to FIGS. 2 and 3. FIG. 2 is a flow diagram illustrating a discharge control method according to the first embodiment. FIG. 3 is a diagram illustrating a discharge control method according to the first embodiment. The discharge method according to the first embodiment includes the following steps. First, when the discharge of the battery cells 100 is performed, a minimum capacity cell in which the voltage is lowest is specified on the basis of the voltages measured by the measurement unit 200 (S120). Next, when the alarm condition in which the voltage of the minimum capacity cell is equal to or less than the alarm voltage value is satisfied (S130; Yes), the first signal is output (S140). Hereinafter, a detailed description will be given.

Here, each of the battery cells 100 is set to be in a state of being charged up to full charge. That is, the discharge voltage of each of the battery cells 100 in an initial step is a voltage value $V_c$ of full charge. In addition, the residual capacity of each of the battery cells 100 is a full charge capacity.

First, in FIG. 2, the positive electrode terminal 810 and the negative electrode terminal 820 of the electronic device 60 are connected to the external positive electrode terminal 710 and external negative electrode terminal 720 of the battery pack 10, respectively. Thereby, discharge from the plurality of battery cells 100 is started. At the same time, the measurement unit 200 measures the voltages and currents of the plurality of battery cells 100 which are connected in series to each other (S110).

Here, power due to the discharge of the battery pack 10 is consumed by the load 600 of the electronic device 60. In addition, the load 600 is controlled by the load control unit 640, and thus operates at a constant current. Meanwhile, here, the internal resistance of the switch 500 is considered to be small enough to be negligible.

Next, the battery control unit 400 specifies the minimum capacity cell in which the voltage is lowest on the basis of the voltages measured by the measurement unit 200 (S120).

Here, FIG. 3(a) shows a relationship between the time from a discharge start time and the voltage of the minimum capacity cell in the first embodiment. Solid lines show a case in which the discharge control method in the first embodiment is applied. On the other hand, dotted lines show a case in which the discharge control method is not applied.

All the battery cells 100 inclusive of the minimum capacity cell are connected in series to each other. For this reason, currents flowing through the respective battery cells 100 are all equal to each other. Therefore, since a full charge capacity $C_{Ra}$ of the minimum capacity cell out of the plurality of battery cells 100 is small, a drop in voltage is faster than those of other battery cells 100. Therefore, the "minimum capacity cell" is specified as the battery cell 100 having the lowest voltage. Meanwhile, in the first embodiment, since two single batteries are connected in parallel to each other within the battery cell 100, a large current flows through the single battery having a smaller internal resistance.

In addition, FIG. 3 (b) shows a relationship between the time from the discharge start time and the residual capacity of the minimum capacity cell in the first embodiment, and a relationship between the time from the discharge start time and the current of the minimum capacity cell. Meanwhile, the residual capacity in FIG. 3(b) refers to the estimation value of the residual capacity calculated by the battery control unit 400.

In FIG. 3(b), the load 600 is operated at a constant current by the load control unit 640. For this reason, discharge to time $t_1$ is constant current discharge. Therefore, the discharge currents of all the battery cells 100 are a constant current value $I_{D1}$ and are constant. In addition, the residual capacity of each of the battery cells 100 drops linearly.

Meanwhile, in the initial step of the discharge, the minimum capacity cell may not be the battery cell 100 having the lowest voltage. In that case, the battery cell 100 having the lowest voltage may be specified as a "minimum capacity cell", and the specified "minimum capacity cell" may be corrected on the basis of the voltages measured at any time.

Next, the battery control unit 400 determines the alarm condition in which the voltage of the minimum capacity cell becomes equal to or less than the alarm voltage value $V_a$ (S130). As described above, the "alarm voltage value $V_a$" is a voltage value for giving an alarm that the above voltage comes close to a voltage for forcibly correcting the estimation value of the residual capacity. Meanwhile, the "discharge reference voltage value $V_1$" is stored in the storage unit of the battery control unit 400.

Next, when the voltage of the minimum capacity cell is higher than the alarm voltage value $V_a$, and the alarm condition is not satisfied (S130; No), the battery control unit 400 continues the discharge of all the battery cells 100 as it is.

On the other hand, when the voltage of the minimum capacity cell becomes the alarm voltage value $V_a$, and the alarm condition is satisfied (S130; Yes), the battery control unit 400 outputs the first signal for reducing the discharge current in the discharge (S140). The first signal is transmitted to the load control unit 640 of the electronic device 60 through the communication terminal 730 of the battery pack 10 and the communication terminal 830 of the electronic device 60.

The "first signal" as used herein refers to a signal which is output in order for the battery control unit 400 to reduce a discharge current on the load 600 side. The "first signal" can be changed depending on the connected electronic device 60. Specifically, the "first signal" may be, for example, a 1-bit signal for switching between the turn-on or turn-off of the load 600. In addition, the "first signal" may be, for example, a signal corresponding to the present voltage value of the minimum capacity cell. In addition, the "first signal" may include a signal corresponding to the present current value (that is, current value of the discharge current) of the battery pack 10.

In addition, a period in which the "first signal" is output can be set to only a moment when the above alarm condition is established. In this case, after the load control unit 640 receives the first signal, the load control unit 640 performs all the controls for reducing a discharge current. On the other hand, the period in which the "first signal" is output may be set to a period continuing while the above alarm condition is satisfied. In this case, the "first signal" can be changed depending on the situation at any time. For example, the battery control unit 400 can continue to transmit a signal corresponding to the present voltage value of the minimum capacity cell stated above.

Here, in FIGS. 3(*a*) and 3(*b*), the time when the alarm condition is satisfied (S130; Yes) is time $t_1$. As shown in FIG. 3(*a*), the voltage of the minimum capacity cell becomes the alarm voltage value $V_a$. Therefore, the voltage of the minimum capacity cell is in a state where the alarm condition is satisfied. Meanwhile, although not shown in the drawing, at time $t_1$, the voltages of other battery cells 100 are equal to or greater than the alarm voltage value $V_a$.

In addition, as shown in FIG. 3(*b*), at time $t_1$, the residual capacity of the minimum capacity cell is $C_a$. The residual capacity of the minimum capacity cell in this case is larger than a first value $C_1$ which is a correction value. Meanwhile, the residual capacities of all the battery cells 100 are also larger than the first value $C_1$ which is a correction value.

Next, when the first signal is received from the battery control unit 400 after time $t_1$, the load control unit 640 reduces the discharge current (S150).

In the first embodiment, the load 600 includes a light-emitting unit such as a backlight. In this case, the load control unit 640 reduces the discharge current by lowering the luminance of the light-emitting unit.

As shown in FIG. 3(*b*), after time $t_1$, the load control unit 640 reduces the discharge current from the constant $t_1$, the load control unit 640 can perform control so that the voltage of the minimum capacity cell has a value larger than the reference voltage $V_1$, on the basis of the first signal. Here, the load control unit 640 reduces the discharge current linearly. Specifically, when the current flowing through the light-emitting unit is reduced, the load control unit 640 drops the luminance. In this case, the residual capacity of the minimum capacity cell drops gently after time $t_1$.

In addition, as shown in FIG. 3(*a*), when the discharge current is not reduced by the load control unit 640, there is the possibility of the voltage of the minimum capacity cell reaching the reference voltage $V_1$ for forcibly correcting the estimation value of the residual capacity at time $t_2$. On the other hand, in the first embodiment, the load control unit 640 reduces the discharge current in S150. Thereby, from time $t_1$ to time $t_3$, the voltage of the minimum capacity cell can be maintained higher than the reference voltage V'. Therefore, it is possible to prevent the estimation value of the residual capacity from being forcibly corrected to the first value.

In S150, as described above, the load control unit 640 may cause the display unit (not shown) of the electronic device 60 to display the start of control for reducing the discharge current. Thereby, it is possible to prepare a user for the use of the electronic device 60 being restricted.

In addition, in S150, the load control unit 640 may perform control so that the discharge current is set to be equal to or greater than a minimum current value required for bringing the electronic device 60 into operation. Thereby, it is possible to use the electronic device 60 for a long time.

As shown in FIG. 3(*b*), further, the load control unit 640 performs the control of the discharge current, and thus the residual capacity of the minimum capacity cell becomes equal to the first value $C_1$ which is a correction value at time $t_4$.

In this case, as shown in FIG. 3(*a*), the voltage of the minimum capacity cell is equal to or greater than the reference value $V_1$ for performing correction. In this manner, the load control unit 640 reduces the discharge current, and thus the voltage of the minimum capacity cell becomes equal to or less than the reference voltage $V_1$. Therefore, it is possible to prevent the estimation value of the residual capacity being forcibly corrected. Therefore, the battery pack 10 can be used continuously.

Meanwhile, it is also considered that before the residual capacity of the minimum capacity cell becomes equal to the first value $C_1$ which is a correction value, the voltage of the minimum capacity cell becomes equal to or less than the reference voltage $V_1$ for performing correction. In this case, when the voltage of the minimum capacity cell becomes equal to or less than the reference voltage, the estimation value of the residual capacity is corrected to the first value $C_1$. Herein, a difference between the estimation value of the immediately preceding residual capacity and the first value $C_1$ of the correction value can be reduced by the control of the discharge current performed by the above-mentioned load control unit 640. Therefore, it is less likely to give a user an impression of a change in residual capacity.

The load control unit 640 reduces the discharge current until the current reaches 0. In this case, the battery control unit 400 terminates the discharge (S190).

On the other hand, the user side may terminate the use of the electronic device 60 arbitrarily (S190).

As described above, the discharge of the battery pack 10 according to the first embodiment is controlled.

Next, an effect of the first embodiment will be described.

First, the need to correct the estimation value of the residual capacity of the battery cell 100 which is calculated by the battery control unit 400 will be described.

As a first reason for correcting the estimation value of the residual capacity, self-discharge of the battery cells 100 is considered. The residual capacity of the battery cell 100 is reduced gradually with the lapse of time in spite of the battery cell 100 not being used. When the battery cell 100 is left unused, the residual capacity may run out. Therefore, even when the battery control unit 400 stores the estimation value of the residual capacity by integrating a charge current value during the charge of the battery pack 10, there is the possibility of a real residual capacity being lower than the estimation value of the residual capacity during a real use of the battery pack.

As a second reason, a case is considered in which the discharge current consumed by the electronic device 60 is large. The battery cell 100 has an internal resistance. For this reason, the voltage of the battery cell 100 during the discharge becomes a value obtained by subtracting a component caused by a voltage drop due to the internal resistance. When the discharge current is large, the contribution of the voltage drop due to the internal resistance increases. For this reason, particularly, the voltage of the minimum capacity cell drops drastically, and thus there is the possibility of over-discharge occurring. Therefore, the reference voltage $V_1$ for forcibly correcting the estimation value of the residual capacity is set, and the over-discharge of the battery cells 100 is prevented beforehand from occurring.

From such reasons, it is necessary to correct the estimation value of the residual capacity of the battery cell 100 which is calculated by the battery control unit 400.

Next, the effect of the first embodiment will be described using FIG. 4 as a comparative example. FIG. 4 is a diagram illustrating a comparative example for describing the effect of the first embodiment.

Unlike the first embodiment, FIG. 4 shows a comparative example in which the battery control unit 400 does not perform control of the discharge of the minimum capacity cell. FIG. 4(*a*) shows a relationship between the time from the discharge start time and the voltage of the minimum capacity cell in the comparative example. In addition, FIG. 4(b) shows a relationship between the time from the discharge start time and the residual capacity of the minimum capacity cell in the comparative example, and a relationship between the time from the discharge start time and the current of the minimum capacity cell. Meanwhile, time t of FIG. 4 is assumed to be the same as time t of FIG. 3. In addition, the discharge current is assumed to be the constant current value $I_{D1}$ and be constant.

As shown in FIG. 4(a), in the comparative example, the voltage of the minimum capacity cell id reduced monotonically from the discharge start. Here, the voltage of the battery cell 100 drops even due to the internal resistance of the battery cell 100, in addition to a drop due to the discharge of the battery cells 100. A voltage drop component due to the internal resistance of the battery cell 100 is proportional to the discharge current. In addition, the internal resistance of the minimum capacity cell of which the full charge capacity is most reduced is larger than those of other battery cells 10. Therefore, a voltage drop component due to the internal resistance of the minimum capacity cell is larger than voltage drop components of the internal resistances of other battery cells 100. Thus, a drop in the voltage of the minimum capacity cell is faster than those of other battery cells 100.

In the comparative example, a case does not occur in which the battery control unit 400 outputs the first signal as in the first embodiment. In addition, the load control unit 640 does not perform the control for reducing the discharge current. Therefore, the voltage of the minimum capacity cell continues to drop along with a reduction in residual capacity even when the voltage becomes lower than the alarm voltage value $V_a$.

At time $t_2$, the voltage of the minimum capacity cell further drops to the reference voltage $V_1$ for correcting the estimation value of the residual capacity. In this manner, the voltage of the minimum capacity cell reaches the reference voltage $V_1$ faster than those of other battery cells 100. In this case, when the voltage of the minimum capacity cell drops to the reference voltage $V_1$, the battery control unit 400 forcibly corrects the estimation value of the residual capacity to the first value $C_1$ which is a correction value. Further, the battery control unit 400 transmits the corrected estimation value of the residual capacity to the load control unit 640 of the electronic device 60 through the communication terminal 730.

In addition, as shown in FIG. 4(b), the residual capacity of the minimum capacity cell is reduced linearly. At time $t_2$, as described above, the voltage of the minimum capacity cell drops to the reference voltage $V_1$ by the contribution of the voltage drop due to the internal resistance. For this reason, the residual capacity of the minimum capacity cell is equal to or greater than the first value $C_1$ which is a correction value, but is forcibly corrected to the first value $C_1$.

In addition, at a point in time $t_2$, the residual capacities of other battery cells 100 are also equal to or greater than the first value $C_1$. Therefore, in the comparative example, there is the possibility of the residual capacities being corrected to the first value $C_1$ in a state where a large amount of residual capacity remains, in a whole of the battery pack 10.

In this manner, when the estimation value of the residual capacity is corrected, a user receives a feeling such as a reduction in residual capacity. For this reason, in the first embodiment, the forcible correction of the estimation value of the residual capacity is suppressed as follows.

According to the first embodiment, the alarm voltage value $V_a$ which is a voltage higher than the reference voltage value $V_1$ is set as the voltages of the battery units in addition to the reference voltage value $V_1$ serving as a trigger of a process of correcting the estimation value of the residual capacity to the first value lower than a value calculated by the battery control unit. When the alarm condition in which the voltage of the minimum capacity unit is equal to or less than the alarm voltage value $V_a$ is satisfied, the battery control unit outputs the first signal. Thereby, it is possible to reduce the discharge current with respect to the electronic device 60, connected to the battery pack 10, which has received the first signal.

In addition, for example, when the discharge current consumed in the load 600 is reduced by the load control unit 640 of the electronic device 60, the consumption of the residual capacity of the minimum capacity cell is reduced. In addition, the above-mentioned voltage drop due to the internal resistance of the battery cell 100 is reduced. Thereby, it is possible to delay the voltage of the minimum capacity cell reaching the reference voltage value $V_1$ for correcting the estimation value of the residual capacity. Therefore, it is possible to prevent the estimation value of the residual capacity from being forcibly corrected due to the voltage of the minimum capacity cell reaching the reference voltage value $V_1$. In other words, it is possible to perform control so that the behavior of the voltage drop of the minimum capacity cell corresponds to the real residual capacity.

As described above, according to the first embodiment, it is possible to prevent the estimation value of the residual capacity from being forcibly corrected due to the voltage of the minimum capacity cell reaching the reference voltage value $V_1$, and to use the battery pack continuously.

Modified Example

As described above, in the first embodiment, a case where the electronic device 60 is a liquid crystal display device has been described, but the electronic device may be a display device including a plurality of light-emitting units such as an organic EL element as pixels. In this case, when the load control unit 640 receives the first signal, it is possible to reduce, for example, a current flowing through all the light-emitting units.

In addition, in the first embodiment, a case has been described in which the voltage of the minimum capacity cell is equal to or greater than the reference voltage $V_1$ when the residual capacity of the minimum capacity cell becomes equal to the first value $C_1$ which is a correction value, by the above-mentioned control. However, it is also considered that before the voltage of the minimum capacity cell becomes the reference voltage $V_1$, the estimation value of the residual capacity calculated by the battery control unit 400 becomes the "first value". In this case, the estimation value of the residual capacity is a value smaller than the real residual capacity. In this case, the battery control unit 400 may perform control as follows.

The battery control unit 400 performs a correction for maintaining the estimation value of the residual capacity to be the "first value" until the estimation value of the residual capacity becomes the "first value $C_1$" and then the voltage of the minimum capacity cell becomes the reference voltage $V_1$. Next, the battery control unit 400 stops this correction using the setting of the voltage of the minimum capacity cell to the reference voltage $V_1$ as a trigger. Thereafter, the battery control unit 400 may calculate the estimation value of the residual capacity again from the "first value $C_1$". In this manner, the estimation value of the residual capacity can be brought closer to the real residual capacity.

Meanwhile, in the above-mentioned first embodiment, the "estimation value of the residual capacity" has set to a total residual capacity of all the battery cells 100 which has been integrated since the charge. However, the "estimation value of the residual capacity" is not limited thereto. It is also possible to obtain the same effect as that in the first embodiment, for example, using a capacity obtained by adding and subtracting (subtraction in discharge and addition in charge) the cumulative integration amount of a charge and discharge current from the full charge capacity of the battery pack 10 which is measured in advance.

In this case, the full charge capacity of the battery pack 10 is obtained by measuring the time integration value of the charge current during the charge of the battery pack 10 without interposing the discharge between the discharge termination voltage and the full charge. Meanwhile, constant-current constant-voltage charge is performed on the battery pack 10 in a case of the full charge, and the above capacity is obtained when the charge current becomes equal to or less than the reference value which is set in advance. In addition, the time integrated value of the current may be measured as electric quantity (coulomb) using a coulomb counter or the like.

Second Embodiment

Figure 5:
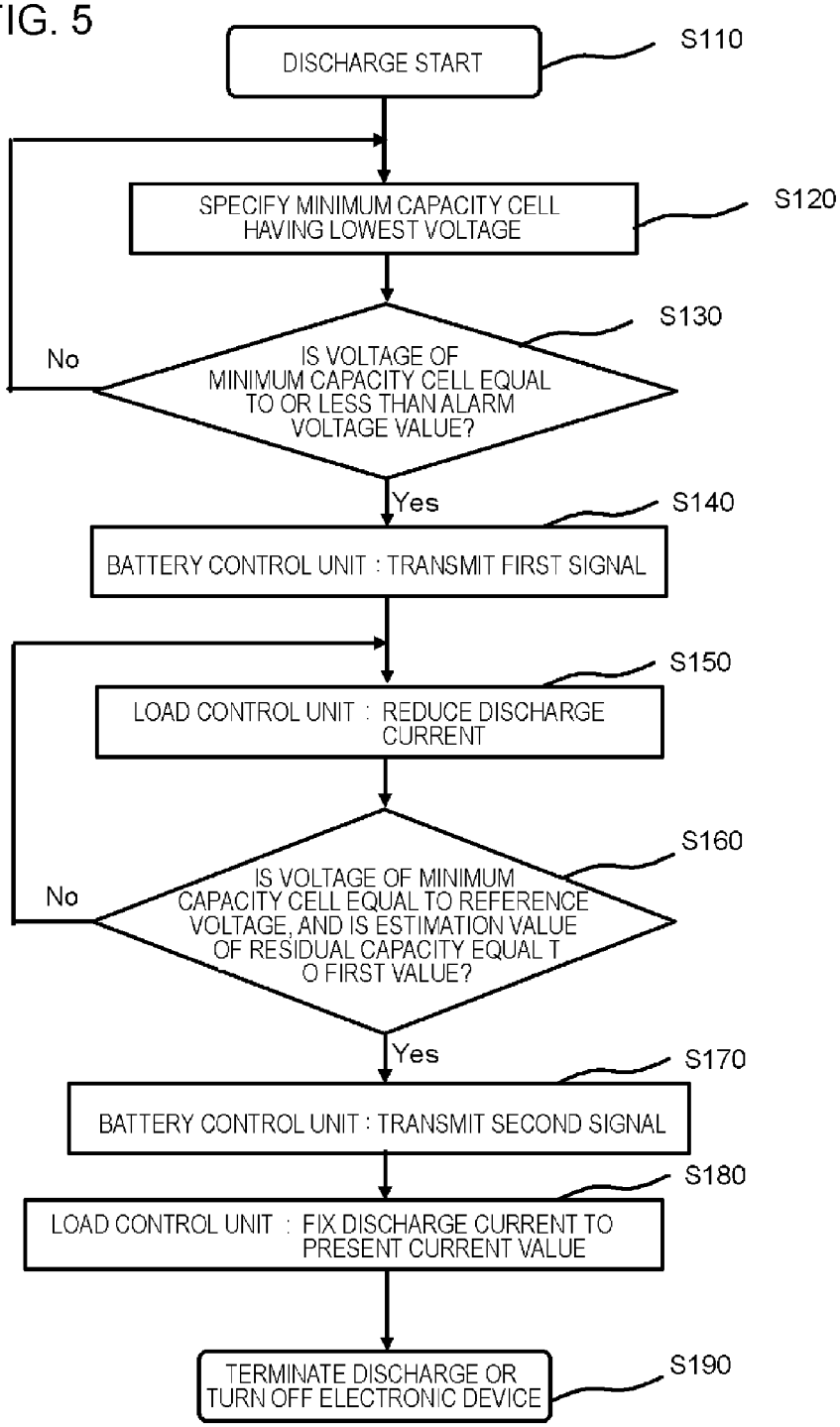
FIG. 5 is a flow diagram illustrating a discharge control method according to a second embodiment.

A second embodiment will be described with reference to FIGS. 5 and 6. FIG. 5 is a flow diagram illustrating a discharge control method according to the second embodiment. FIG. 6 is a diagram illustrating a discharge control method according to the second embodiment. The second embodiment is the same as the first embodiment, except that the contents of control performed by the load control unit 640 after S150 are different. Hereinafter, a detailed description will be given.

The same battery pack 10 can be used in the second embodiment as in the first embodiment. In addition, the electronic device 60 is, for example, a display device as is the case with the first embodiment.

FIG. 6(*a*) shows a relationship between the time from the discharge start time and the voltage of the minimum capacity cell in the second embodiment. In addition, FIG. 6 (*b*) shows a relationship between the time from the discharge start time and the residual capacity of the minimum capacity cell in the second embodiment, and a relationship between the time from the discharge start time and the current of the minimum capacity cell.

Here, as shown in FIG. 6(*a*), at time $t_1$, the voltage of the minimum capacity cell becomes equal to or less than the alarm voltage value $V_a$. Therefore, the voltage of the minimum capacity cell is in a state where the alarm condition is satisfied.

As shown in FIG. 5, at time $t_1$, when the alarm condition in which the voltage of the minimum capacity cell is equal to or less than the alarm voltage value $V_a$ is satisfied (S130; Yes), the battery control unit 400 outputs the first signal for reducing the discharge current in the discharge (S140).

In addition, as shown in FIG. 6(*b*), at time $t_1$, the residual capacity of the minimum capacity cell is $C_a$. That is, the residual capacity of the minimum capacity cell is larger than the first value $C_1$ which is a correction value. Meanwhile, the residual capacities of all the battery cells 100 are also larger than the first value $C_1$ which is a correction value.

Next, when the first signal is received from the battery control unit 400 after time $t_1$, the load control unit 640 reduces the discharge current (S150). In this case, the load control unit 640 controls the load 600 so that the estimation value of the residual capacity becomes equal to the first value $C_1$ when the voltage of the minimum capacity cell becomes the reference voltage $V_1$, on the basis of the first signal.

That is, as shown in FIG. 6(*a*), after time $t_1$, the load control unit 640 can perform control so that the voltage of the minimum capacity cell is set to a value larger than the reference voltage $V_1$ by reducing the discharge current on the basis of the first signal. After time $t_1$, the voltage of the minimum capacity cell drops gently.

In addition, as shown in FIG. 6(*b*), after time $t_1$, the current reduces drastically by controlling the load control unit 640. Thus, the residual capacity of the minimum capacity cell is reduced gently.

Next, the battery control unit 400 determines whether the voltage of the minimum capacity unit is equal to the reference voltage $V_1$, and the estimation value of the residual capacity is equal to the first value $C_1$ (S160). When this condition is not satisfied (S160; No), the load control unit 640 continues the control for reducing the discharge current.

Next, as shown in FIG. 6(*a*), further, the load control unit 640 controls the discharge current, and thus the voltage of the minimum capacity cell becomes equal to the reference voltage $V_1$ at time $t_3$.

In this case, as shown in FIG. 6(*b*), the residual capacity of the minimum capacity cell becomes equal to the first value $C_1$ which is a correction value. In this manner, when the voltage of the minimum capacity unit becomes equal to the reference voltage V', and the estimation value of the residual capacity becomes equal to the first value $C_1$ (S160; Yes), the battery control unit 400 outputs a second signal which is different from the first signal (S170).

When the second signal is received, the load control unit 640 fixes the discharge current to the present current value at time $t_3$ (S180). Thereby, even after time $t_3$, the estimation value of the residual capacity can be made to be equal to a residual capacity expected from the voltage of the minimum capacity cell.

As described above, a discharge control according to the second embodiment is performed.

According to the second embodiment, it is possible to obtain the same effect as that in the first embodiment. Further, according to the second embodiment, when the voltage of the minimum capacity unit becomes equal to the reference voltage $V_1$, and the estimation value of the residual capacity becomes equal to the first value $C_1$, the load control unit 640 fixes the discharge current to the present current value. Thereby, from the time when the above condition is satisfied, the estimation value of the residual capacity can be made to be equal to a residual capacity expected from the voltage of the minimum capacity cell.

Third Embodiment

Figure 7:
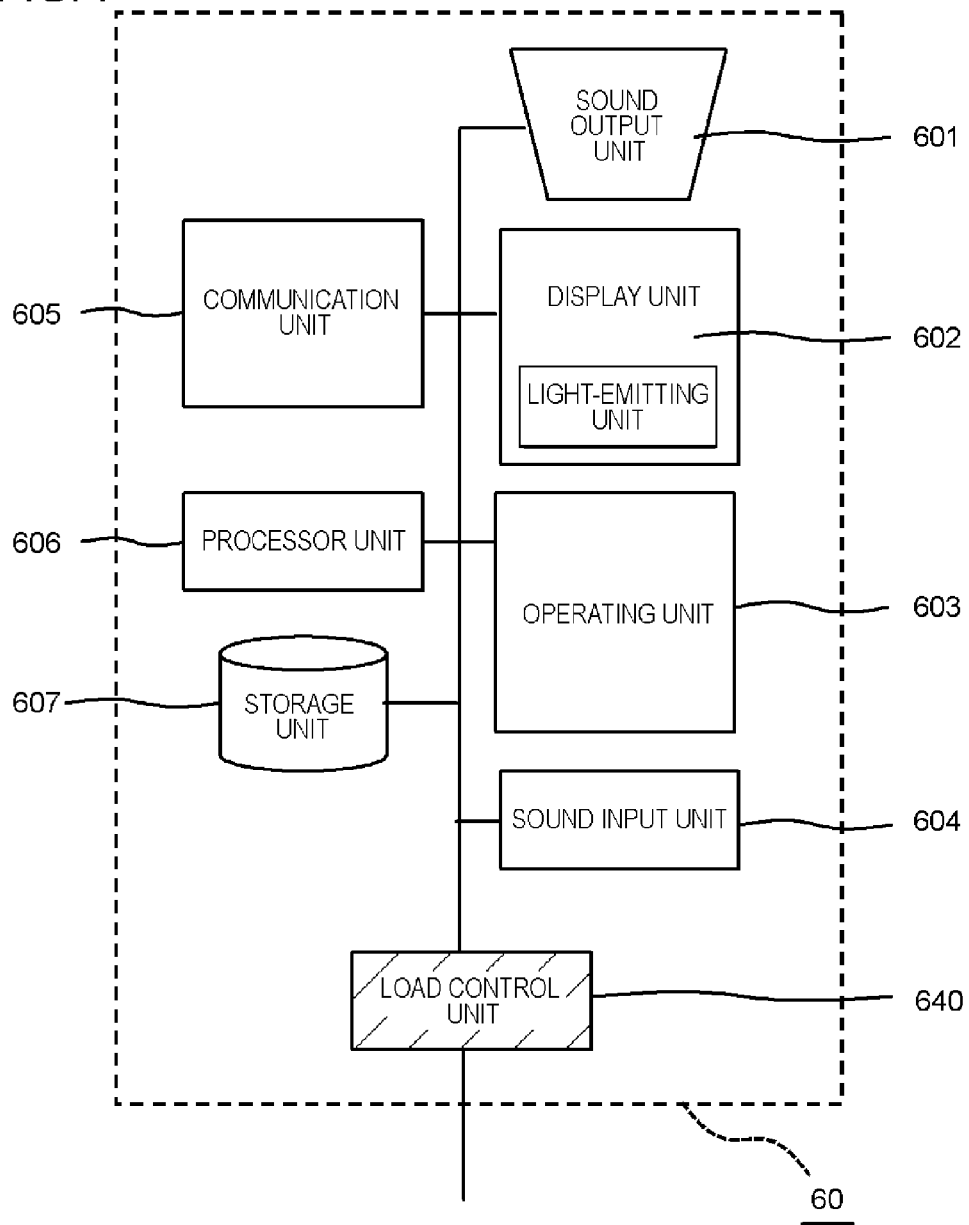
FIG. 7 is a schematic diagram illustrating a configuration of an electronic device according to a third embodiment.

FIG. 7 is a schematic diagram illustrating a configuration of an electronic device 60 according to a third embodiment. The third embodiment is the same as the first embodiment, except that there are a plurality of loads 600. Hereinafter, a detailed description will be given.

Here, as shown in FIG. 7, the electronic device 60 according to the third embodiment is, for example, a portable communication terminal that performs a phone call or packet communication through the transmission and reception of electromagnetic waves.

This electronic device 60 includes, for example, a sound output unit (sound output unit 601), a display unit 602 provided with a light-emitting unit, an operating unit (operating unit 603), a sound input unit (sound input unit 604), a communication unit (communication unit 605), an arithmetic operation process unit (processor unit 606), a storage unit (storage unit 607) and a load control unit (load control unit 640). The arithmetic operation process unit (processor unit 606) is used for performing an arithmetic operation process of the electronic device 60.

The sound output unit 601 is a speaker that outputs a sound of a phone call. In addition, the sound input unit 604 is a microphone that inputs a sound of a phone call. In addition, the display unit 602 provided with a light-emitting unit is a liquid crystal display device that displays characters such as a phone number or a mail, and an image. In addition, the processor unit 606 performs an arithmetic operation process on a signal such as a sound signal of a phone call or data of packet communication. The storage unit 607 stores data such as a phone number or a mail. The communication unit 605 transmits and receives a signal such a sound signal or packets through electromagnetic waves. In this manner, the electronic device 60 of the third embodiment includes a plurality of loads 600.

The load control unit 640 is connected to the same battery pack 10 as that in the first embodiment, in a region which is not shown in the drawing. In addition, the load control unit 640 is connected to each of the loads 600 mentioned above. Thereby, the load control unit 640 can control the amount of power consumption of each of the loads 600.

Meanwhile, an interconnect (not shown) for supplying power to each of the loads 600 may not necessarily be connected to each of the loads 600 through the load control unit 640.

Here, a state of S140 in FIG. 2 is assumed. That is, this state is a state where an alarm condition in which the voltage of the minimum capacity cell in the battery pack 10 is equal to or less than the alarm voltage value $V_a$ is satisfied, and the battery control unit 400 transmits the first signal to the load control unit 640.

When all the loads 600 are used as they are, the voltage of the minimum capacity cell reaches the reference voltage $V_1$. That is, the estimation value of the residual capacity is forcibly corrected to the first value $C_1$. Consequently, when the first signal is received from the battery control unit 400, the load control unit 640 reduces the discharge current of the loads 600 as follows.

For example, as is the case with the first embodiment, the load control unit 640 gradually drops the luminance of the light-emitting unit of the display unit 602. In this manner, the load control unit 640 gradually reduces the discharge current consumed in the loads 600.

In addition, for example, as is the case with the first embodiment, when the first signal is received from the battery control unit 400, the load control unit 640 may cause the display unit 602 of the electronic device 60 to display the start of the control for reducing the discharge current. Thereby, it is possible to prepare a user for the use of the electronic device 60 being restricted.

In addition, for example, the load control unit 640 lowers the processing speed of the processor unit 606. Here, "lowers the processing speed of the processor unit 606" is to lower the clock frequency of the processor unit 606. In this manner, it is possible to reduce a current consumed in the processor unit 606 by lowering the clock frequency.

In addition, for example, the load control unit 640 controls the communication unit 605 so as to restrict a phone call and perform only packet communication. In the transmission and reception of a sound signal through a phone call, power consumed in the communication unit 605 is greater than in the transmission and reception of a data signal through packet communication. In this manner, the load control unit 640 can impose a restriction of using only the load 600 having relatively small power consumption.

As described above, the load control unit 640 may gradually reduce the number of loads 600 that consume power at the present time. Thereby, it is possible to reduce the discharge current in units of the loads 600.

According to the third embodiment, the electronic device 60 includes the plurality of loads 600. In such a case, when the first signal is received from the battery control unit 400, the load control unit 640 can appropriately select a method of reducing a discharge current. The load control unit 640 may gradually reduce the number of loads 600 that consume power at the present time. Thereby, it is possible to reduce the discharge current in units of the loads 600. Therefore, even when the electronic device 60 includes a plurality of loads 600, it is possible to suppress the forcible correction of the estimation value of the residual capacity. In addition, a user employs the load 600 capable of being used restrictively, but can use the electronic device 60 continuously.

Fourth Embodiment

Figure 8:
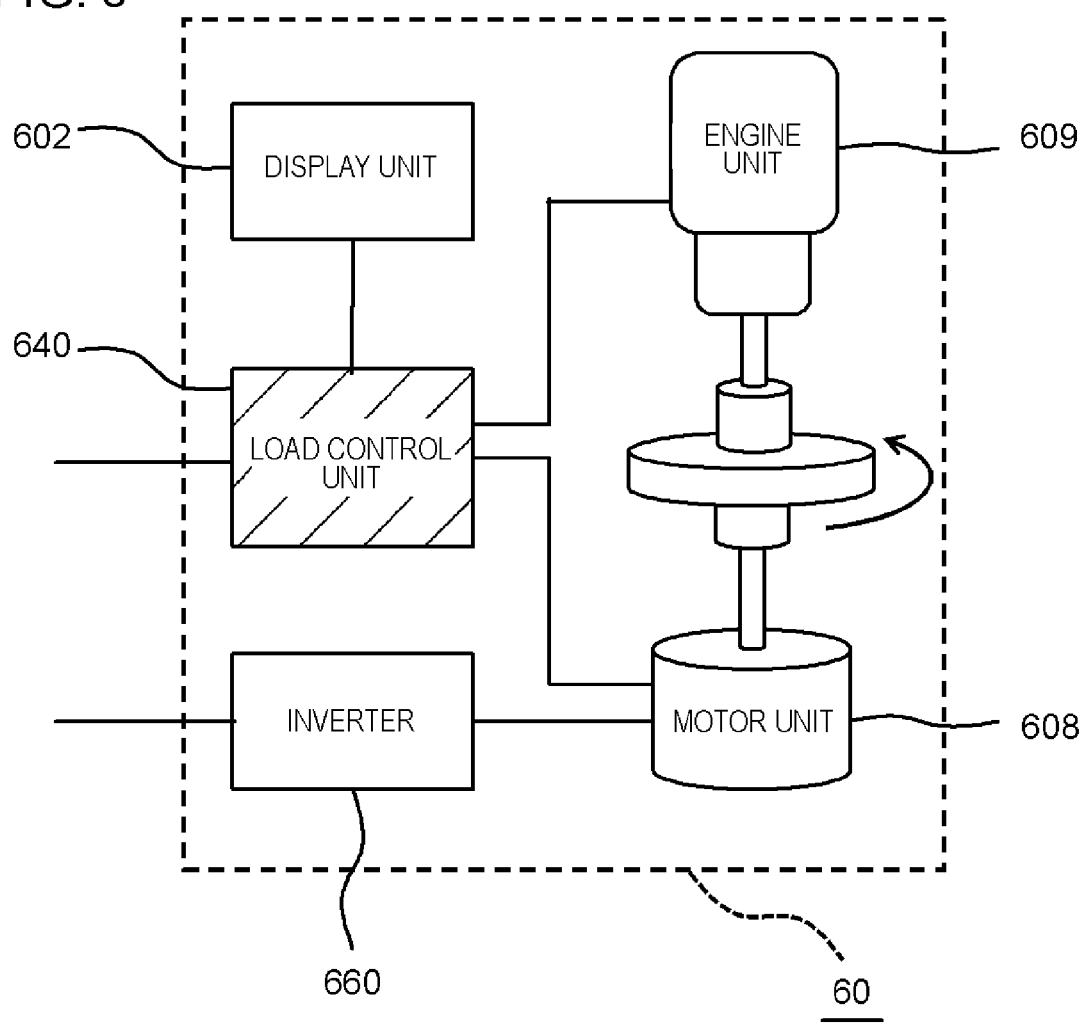
FIG. 8 is a schematic diagram illustrating a configuration an electronic device according to a fourth embodiment.

FIG. 8 is a schematic diagram illustrating a configuration of an electronic device 60 according to a fourth embodiment. The fourth embodiment is the same as the first embodiment, except that the electronic device 60 is a motive power control device of a hybrid car or an electric automobile. Hereinafter, a detailed description will be given.

Here, as shown in FIG. 8, the electronic device 60 according to the fourth embodiment is, for example, a motive power control device such as a hybrid car. The same battery pack 10 as that in the first embodiment is mounted to the hybrid car, and is connected to the electronic device 60.

This electronic device 60 includes an electric drive unit (motor unit 608), a fuel drive unit (engine unit 609), a load control unit (load control unit 640) and an inverter 660. The load control unit 640 is connected to the battery control unit 400 of the battery pack 10, in a region which is not shown in the drawing. In addition, the inverter 660 is connected to the external positive electrode terminal 710 and the external negative electrode terminal 720 of the battery pack 10, in a region which is not shown in the drawing. Meanwhile, the electric drive unit (motor unit 608) is used for converting electrical energy into mechanical energy, and the fuel drive unit (engine unit 609) is used for converting combustion energy of fuel into mechanical energy.

The motor unit 608 converts power from the battery pack 10 into motive power of an automobile. In addition, the motor unit 608 converts the motive power of an automobile into power through the inverter 660, and can supply the converted power to the battery pack 10.

The engine unit 609 provides motive power to an automobile by burning gasoline. The load control unit 640 is connected to the motor unit 608 and the engine unit 609. Thereby, the load control unit 640 controls a ratio by which each of the loads 600 contributes to the motive power of an automobile.

Meanwhile, an interconnect (not shown) for supplying power to the motor unit 608 may not necessarily be connected through the load control unit 640.

Here, the hybrid car is driven by the motor unit 608, and is assumed to be in a state of S140 in FIG. 2. That is, this state is a state where an alarm condition in which the voltage of the minimum capacity cell in the battery pack 10 is equal to or less than the alarm voltage value $V_a$ is satisfied, and the battery control unit 400 transmits the first signal to the load control unit 640.

When only the motor unit 608 continues to be driven as it is, the voltage of the minimum capacity cell reaches the reference voltage V'. That is, the estimation value of the residual capacity is forcibly corrected to the first value $C_1$. Consequently, when the first signal is received from the battery control unit 400, the load control unit 640 reduces the discharge current of the loads 600 as follows.

For example, the load control unit 640 reduces the power supply amount from the battery pack 10 to the motor unit 608, and increases a drive ratio in the engine unit 609. In other words, the load control unit 640 performs control so that the contribution ratio to motive power becomes gradually larger in the engine unit 609. Meanwhile, the drive may be switched from the motor unit 608 to the engine unit 609. Thereby, it is possible to reduce a discharge current consumed in the motor unit 608. In this manner, it is possible to perform gradual switching to the load 600 (engine unit 609) using other energy.

According to the fourth embodiment, it is possible to obtain the same effect as that in the first embodiment.

As described above, in the fourth embodiment, a case of the hybrid car has been described, but an electric automobile may be used. In this case, when the first signal is received from the battery control unit 400, the load control unit 640 reduces a discharge current by reducing power which is supplied to the motor unit 608. Meanwhile, in this case, since there is only one motive power source, it is preferable that the load control unit 640 gradually reduce the discharge current.

In addition, in the fourth embodiment, a case of the hybrid car has been described, but an electric power-assisted bicycle may be used. In a case of an electric power-assisted bicycle, it is considered that an assist force is lowered in association with the forcible correction of the residual capacity. In that case, a user feels that the bicycle has increased in weight. Consequently, when the first signal is received from the battery control unit 400, the load control unit 640 gradually reduces the power which is supplied to the motor unit 608. That is, the load control unit 640 gradually weakens an assist force of the motor unit 608. Thereby, it is possible to use the motor unit 608 with little change in load felt by a user.

Fifth Embodiment

Figure 9:
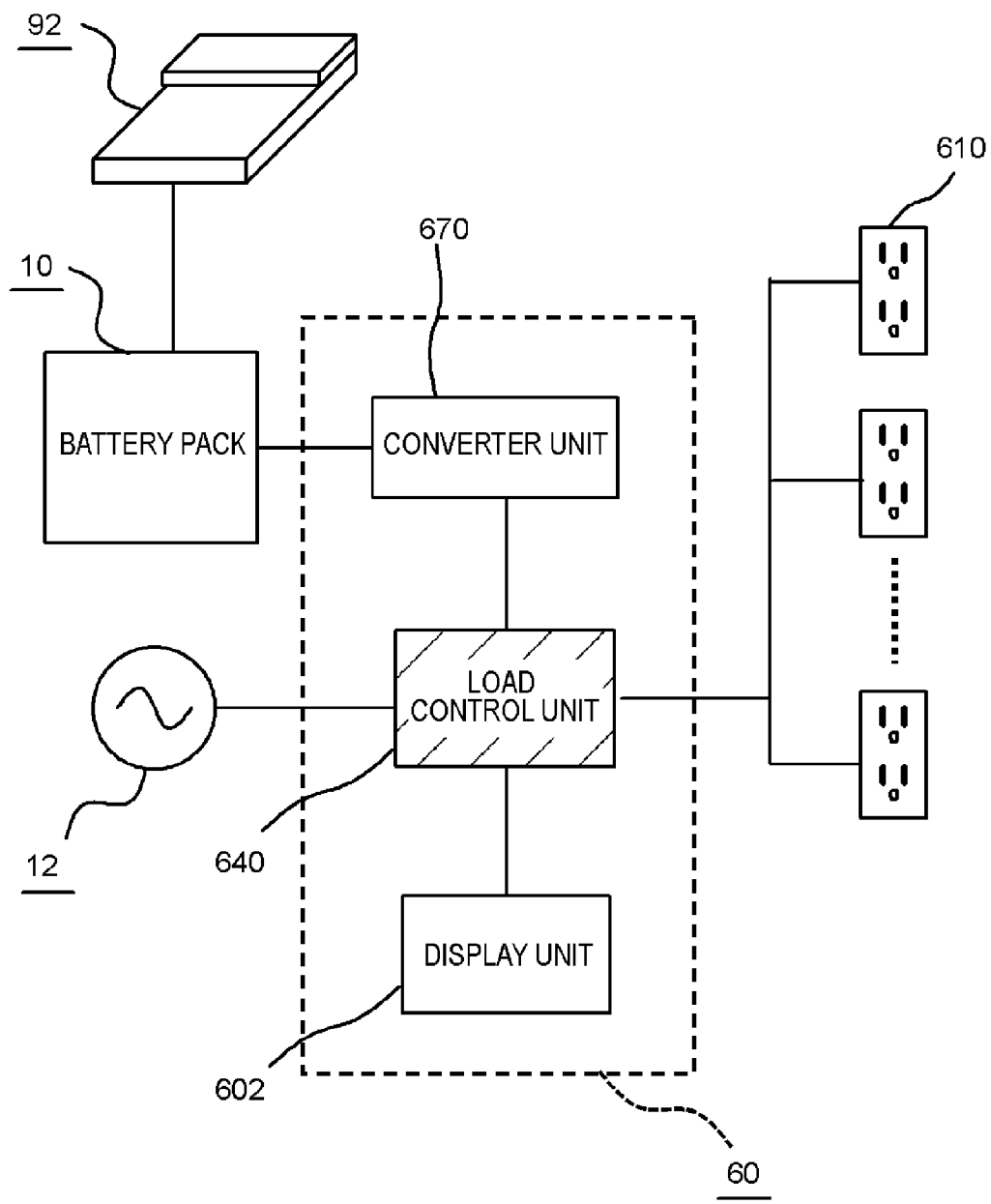
FIG. 9 is a schematic diagram illustrating a configuration of an electronic device according to a fifth embodiment.

FIG. 9 is a schematic diagram illustrating a configuration of an electronic device 60 according to a fifth embodiment. The fifth embodiment is the same as the first embodiment, except that the electronic device 60 is connected to at least one or more other power supply units 12 other than the battery pack 10. Hereinafter, a detailed description will be given.

Here, as shown in FIG. 9, the electronic device 60 according to the fifth embodiment is, for example, a power control device that controls power from a plurality of power supply sources.

The same battery pack 10 as that in the first embodiment is connected to a solar battery 92. The solar battery 92 converts light energy of sunlight into power. When photovoltaic power is supplied from the solar battery 92, the battery pack 10 is charged by the power.

In addition, the electronic device 60 includes a converter unit 670 and a load control unit 640. The converter unit 670 converts a direct current supplied from the battery pack 10 into an alternating current. In addition, the converter unit 670 has a function of transmitting a first signal which is transmitted from the battery pack 10. Meanwhile, an interconnect (not shown) for transmitting the first signal from the battery pack 10 directly to the load control unit 640 may be connected thereto. In addition, the battery pack 10 is connected to the converter unit 670 of the electronic device 60.

The load control unit 640 is connected to other power supply units 12. The power supply unit 12 is, for example, a distribution switchboard of power which is supplied from an electric power company. For example, an alternating current is supplied from the power supply unit 12.

The load control unit 640 is connected to a plurality of household power supply receptacles 610. Various loads 600 are connected to the power supply receptacles 610 by a user.

Here, it is assumed that power is supplied to the power supply receptacles 610 from the battery pack 10. In addition, the battery pack 10 is assumed to be in a state of S140 in FIG. 2. That is, this state is a state where an alarm condition in which the voltage of the minimum capacity cell in the battery pack 10 is equal to or less than the alarm voltage value $V_a$ is satisfied, and the battery control unit 400 transmits the first signal to the load control unit 640.

When power is continuously consumed from only the battery pack 10 as it is, the voltage of the minimum capacity cell reaches the reference voltage $V_1$. That is, the estimation value of the residual capacity is forcibly corrected to the first value $C_1$.

Consequently, when the first signal is received from the battery control unit 400, the load control unit 640 reduces the power supply amount from the battery pack 10 to the power supply receptacles 610, and increases the power supply amount from other power supply units 12 to the power supply receptacles 610. Thereby, it is possible to suppress the forcible correction of the estimation value of the residual capacity to the first value $C_1$.

Meanwhile, a ratio by which the other power supply units 12 contribute may be gradually increased without discontinuously switching from the battery pack 10 to other power supply units 12.

According to the fifth embodiment, the electronic device 60 is connected to at least one or more other power supply units 12 other than the battery pack 10. In such a case, it is also possible to obtain the same effect as that in the first embodiment. In addition, when the battery pack 10 is provided in preparation for the failure of power supply of other power supply units 12, it is preferable that the battery pack 10 be able to be used for a long time. Therefore, according to the fifth embodiment, it is possible to prevent the residual capacity of the battery pack 10 from being drastically reduced, and to sustain the battery pack 10 for a long time.

Sixth Embodiment

Figure 10:
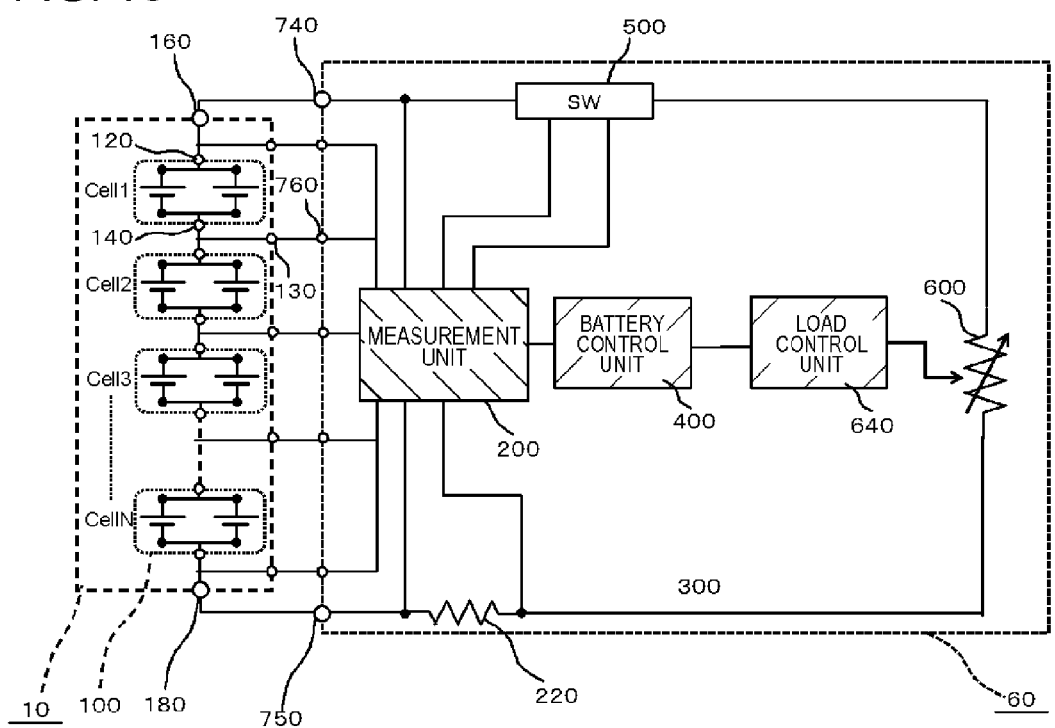
FIG. 10 is a circuit diagram illustrating a configuration a battery pack and an electronic device according to a sixth embodiment.

FIG. 10 is a circuit diagram illustrating a configuration of a battery pack 10 and an electronic device 60 according to a sixth embodiment. The sixth embodiment is the same as the first embodiment, except that the control circuit 20 of the battery pack 10 in the first embodiment is included in the electronic device 60. Hereinafter, a detailed description will be given.

As shown in FIG. 10, the battery pack 10 of the sixth embodiment is not provided with the control circuit 20. That is, the battery pack 10 includes only a plurality of battery cells 100 which are connected in series to each other. The positive electrode terminal 160 is provided on the side of Cell 1 of the battery pack 10. On the other hand, the negative electrode terminal 180 is provided on the side of Cell N of the battery pack 10. In addition, a battery cell terminal 130 is provided between each of the battery cells 100.

The electronic device 60 of the sixth embodiment includes the measurement unit 200, the battery control unit 400 and the switch 500 in addition to the load 600 and the load control unit 640. A measurement terminal 760 is provided on the battery pack 10 side of the electronic device 60.

In addition, a positive electrode terminal 740 and a negative electrode terminal 750 are provided on the battery pack 10 side of the electronic device 60. The positive electrode terminal 740 and the negative electrode terminal 750 of the electronic device 60 are respectively connected to the positive electrode terminal 160 and the negative electrode terminal 180 of the battery pack 10. Thereby, the electronic device 60 can receive a supply of power from the battery pack 10.

In addition, the measurement unit 200 is connected to the measurement terminal 760. The measurement terminal 760 of the electronic device 60 is connected to the battery cell terminal 130 of the battery pack 10 through an interconnect (no sign shown). Thereby, the measurement unit 200 can measure the voltage of each of the battery cells 100.

According to the sixth embodiment, it is possible to obtain the same effect as that in the first embodiment. Further, according to the sixth embodiment, it is possible to simplify the battery pack 10 which is frequently exchanged.

In the aforementioned embodiments, a case has been described in which the battery control unit 400 transmits a signal to the switch 500 through the measurement unit 200, but the battery control unit 400 may transmit a signal directly to the switch 500.

As described above, although the embodiments of the present invention have been set forth with reference to the drawings, they are merely illustrative of the present invention, and various configurations other than those stated above can be adopted. For example, in the above embodiments, a case where the battery cell 100 is a laminate-type battery has been described, but the effect of the present invention can be obtained similarly even when the battery cell 100 is a battery having other forms such as a cylindrical shape and a square shape.

The invention claimed is:

1. A battery control system comprising:
a measurement unit configured to measure voltages and currents of a plurality of battery units, which are connected in series to each other;
a battery control unit configured to control discharge of the battery units on the basis of the voltages measured by the measurement unit; and
a terminal, which is connected to the battery control unit, configured to communicate with an external device,
wherein the battery control unit is further configured to:
specify a minimum capacity unit in which the voltage is lowest, on the basis of the voltages measured by the measurement unit,
determine an estimation value of a present residual capacity of the battery units by integrating the currents,
continue the discharge of all the battery units while an alarm condition is not satisfied, the alarm condition being a condition in which the voltage of the minimum capacity unit is equal to or less than an alarm voltage value, the alarm voltage value being a voltage value that is greater than a reference voltage value that serves as a trigger of a process of correcting the estimation value of the residual capacity, and
output a first signal via the terminal when the voltage of the minimum capacity unit satisfies the alarm condition.

2. The battery control system according to claim 1, wherein the battery control unit is further configured to correct the estimation value of the residual capacity to a predetermined first value that is greater than zero when the voltage of the minimum capacity unit equals the reference voltage value.

3. The battery control system according to claim 1, wherein the reference voltage is greater than a discharge termination voltage value at which the battery units are over-discharged.

4. The battery control system according to claim 1, wherein the battery control unit is further configured to output a residual capacity signal indicating the estimation value of the residual capacity of the battery units.

5. The battery control system according to claim 1, further comprising a display unit configured to display the estimation value of the residual capacity of the battery units.

6. The battery control system according to claim 1, further comprising a load control unit that is connected to the battery control unit, and the load control unit is configured to receive the first signal and control a load consuming power of the discharge,
wherein the load control unit is further configured to reduce the discharge current when the first signal is received from the battery control unit.

7. The battery control system according to claim 6, wherein the battery control unit is further configured to, when the voltage of the minimum capacity unit becomes equal to the reference voltage, or the estimation value of the residual capacity becomes equal to the first value, output a second signal, which is different from the first signal, and
the load control unit is further configured to fix the discharge current to a present current value when the second signal is received.

8. The battery control system according to claim 1, wherein the battery units include a lithium-ion secondary battery.

9. A battery pack comprising:
a plurality of battery units which are connected in series to each other;
a measurement unit configured to measure voltages and currents of the battery units;
a battery control unit configured to control discharge of the battery units on the basis of the voltages measured by the measurement unit; and
a terminal, which is connected to the battery control unit, configured to communicate with an external device,
wherein the battery control unit is further configured to:
specify a minimum capacity unit in which the voltage is lowest, on the basis of the voltages measured by the measurement unit,
determine an estimation value of a present residual capacity of the battery units by integrating the currents,
continue the discharge of all the battery units while an alarm condition is not satisfied, the alarm condition being a condition in which the voltage of the minimum capacity unit is equal to or less than an alarm voltage value, the alarm voltage value being a voltage value greater than a reference voltage value that serves as a trigger of a process of correcting the estimation value of the residual capacity, and output a first signal, via the terminal, when the voltage of the minimum capacity unit satisfies the alarm condition.

* * * * *

UNITED STATES PATENT AND TRADEMARK OFFICE
CERTIFICATE OF CORRECTION

PATENT NO. : 9,735,592 B2  
APPLICATION NO. : 14/381886  
DATED : August 15, 2017  
INVENTOR(S) : Tadahiro Yoshida Page 1 of 1

It is certified that error appears in the above-identified patent and that said Letters Patent is hereby corrected as shown below:

In the Drawings

Sheet 3, Fig. 3(b):
Delete the low-quality printing of FIG. 3(b) and insert the originally filed FIG. 3(b)

Sheet 6, Fig. 6(b):
Delete the low-quality printing of FIG. 6(b) and insert the originally filed FIG. 6(b)

In the Specification

Description of Embodiments, Column 6, Line 41:
"V'," has been replaced with --$V_1$,--

Description of Embodiments, Column 6, Line 48:
"V'," has been replaced with --$V_1$,--

Description of Embodiments, Column 7, Line 29:
"V'," has been replaced with --$V_1$,--

Description of Embodiments, Column 11, Line 28:
After "constant", insert --current value $I_{D1}$. Thereby, as shown in FIG. 3 (a), after time--

Description of Embodiments, Column 11, Line 45:
"V'," has been replaced with --$V_1$,--

Description of Embodiments, Column 16, Line 31:
"V'," has been replaced with --$V_1$,--

Description of Embodiments, Column 19, Line 10:
"V'," has been replaced with --$V_1$,--

Signed and Sealed this  
Fourth Day of December, 2018

Andrei Iancu  
*Director of the United States Patent and Trademark Office*